(12) United States Patent
Mahowald

(10) Patent No.: US 9,985,186 B2
(45) Date of Patent: May 29, 2018

(54) LIGHT EMITTING DIODE LAMINATED WITH A PHOSPHOR SHEET AND MANUFACTURING METHOD THEREOF

(71) Applicant: Lumileds LLC, San Jose, CA (US)

(72) Inventor: Peter Mahowald, Eindhoven (NL)

(73) Assignee: Lumileds LLC, San Jose, CA (US)

( * ) Notice: Subject to any disclaimer, the term of this patent is extended or adjusted under 35 U.S.C. 154(b) by 0 days. days.

(21) Appl. No.: 14/896,371

(22) PCT Filed: May 22, 2014

(86) PCT No.: PCT/IB2014/061622
§ 371 (c)(1),
(2) Date: Dec. 4, 2015

(87) PCT Pub. No.: WO2014/195819
PCT Pub. Date: Dec. 11, 2014

(65) Prior Publication Data
US 2016/0126429 A1 May 5, 2016

Related U.S. Application Data

(60) Provisional application No. 61/831,750, filed on Jun. 6, 2013.

(51) Int. Cl.
*H01L 33/50* (2010.01)
*H01L 25/075* (2006.01)

(52) U.S. Cl.
CPC ........ *H01L 33/505* (2013.01); *H01L 25/0753* (2013.01); *H01L 33/501* (2013.01); *H01L 2224/16225* (2013.01); *H01L 2924/0002* (2013.01); *H01L 2933/0041* (2013.01)

(58) Field of Classification Search
CPC ................ H01L 33/505; H01L 33/501; H01L 27/1259–27/1296; H01L 51/5253–51/5256; H01L 51/0096–51/0097; H01L 33/483–33/486; H01L 2933/0033; H01L 2933/0025; H01L 33/52; H01L 33/56; H01L 2933/005; H01L 25/0753
See application file for complete search history.

(56) References Cited

U.S. PATENT DOCUMENTS 5,866,952 A * 2/1999 Wojnarowski ........ H01L 21/568
257/687
2007/0096131 A1* 5/2007 Chandra ............... H01L 33/505
257/99

FOREIGN PATENT DOCUMENTS

EP 2426707 A1 3/2012
EP 2584619 A2 4/2013
JP 2003046140 A 2/2003
(Continued)

OTHER PUBLICATIONS

EPO as ISA, PCT/IB2014/061622, filed May 22, 2014, "International Search Report and Written Opinion" dated Jul. 28, 2014, 17 pages.

*Primary Examiner* — Tucker J Wright
(74) *Attorney, Agent, or Firm* — Volpe and Koenig, P.C.

(57) ABSTRACT

A method for laminating a film over a light emitting diode (LED), where the thickness of a portion of the film disposed over the top surface of the LED is reduced by pressing a flattening element against the top surface of the LED. The resulting form of the phosphor encapsulation allows for an improved color homogeneity.

10 Claims, 2 Drawing Sheets

(56) References Cited

FOREIGN PATENT DOCUMENTS

| | | |
|---|---|---|
| JP | 2003046140 A2 | 2/2003 |
| JP | 2010-093059 A | 4/2010 |
| JP | 2011138831 A | 7/2011 |
| JP | 2011138831 A2 | 7/2011 |
| KR | 101135093 B1 | 4/2012 |
| WO | 2012023119 A1 | 2/2012 |

* cited by examiner

LIGHT EMITTING DIODE LAMINATED WITH A PHOSPHOR SHEET AND MANUFACTURING METHOD THEREOF

CROSS-REFERENCE TO RELATED APPLICATIONS

The present application is a § 371 application of International Application No. PCT/IB2014/061622 filed on May 22, 2014 and entitled "Light emitting diode laminated with a phosphor sheet and manufacturing method thereof," which claims the benefit of U.S. Provisional Application Ser. No. 61/831,750, filed Jun. 6, 2013. Both PCT/IB2014/61622 and U.S. 61/831,750 are incorporated herein.

FIELD OF THE INVENTION

The present invention relates to laminating a layer such as a wavelength converting layer over a semiconductor device such as a light emitting device.

BACKGROUND

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

FIG. 1 illustrates an LED with a laminated phosphor layer, described in more detail in WO 2012/023119 A1. The abstract states "A method is described for laminating a layer (28) over an array of LED dies (10) on a submount wafer (12). The layer (28) may comprise phosphor powder in a silicone binder. The layer is formed on a support film then dried. The layer is then mounted over the LED dies (10), and the structure is heated in a vacuum. Downward pressure is placed on the support film so that the layer adheres to the tops of the LED dies and forms an airtight seal around the periphery of the wafer. The structure is then exposed to ambient air, and the support film is removed. The seal prevents ambient air from entering between the layer (28) and the wafer (12). In a second lamination step, the structure is heated to a higher temperature in a vacuum to remove the remaining air between the layer and the wafer. The structure is then exposed to ambient air pressure, which conforms the heated layer to the LED dies."

SUMMARY

It is an object of the invention to provide a wavelength converting layer laminated over a light emitting device, where light emitted from the structure has reduced variation in the color field.

A method according to embodiments of the invention includes laminating a film over a light emitting diode (LED). A thickness of a portion of the film disposed over a top surface of the LED is reduced by pressing a flattening element against a top surface of the LED.

Embodiments of the invention include a light emitting diode (LED) attached to a mount. A wavelength converting film is disposed over a top surface and a sidewall of the LED. A thickness of the wavelength converting film at a first portion of the sidewall is greater than a thickness of the wavelength converting film at a second portion of the sidewall. The first portion is located closer to the top surface of the LED than the second portion.

DETAILED DESCRIPTION

Figure 1:
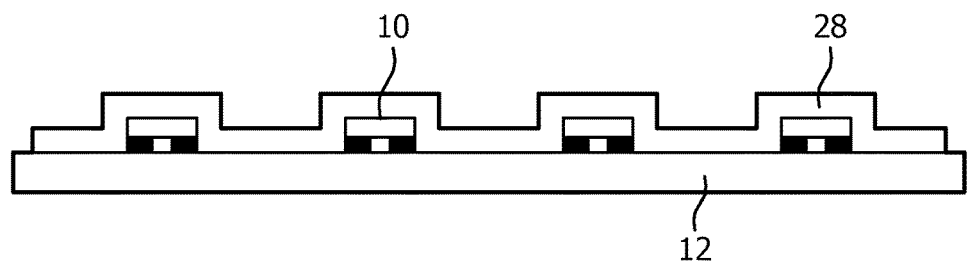
FIG. 1 illustrates an LED with a laminated phosphor layer.

In the lamination process illustrated in FIG. 1, the phosphor layer is stretched over the sides and edges of the LED, creating non-uniformity in the thickness of the phosphor layer, which may change the color point in the near field. In embodiments of the invention, the thickness of a wavelength converting film over the top of the LED may be reduced, which may improve the uniformity in the thickness of the wavelength converting film, which may improve the performance of the device.

Though in the examples below the semiconductor light emitting device are III-nitride LEDs that emits blue or UV light, semiconductor light emitting devices besides LEDs such as laser diodes and semiconductor light emitting devices made from other materials systems such as other III-V materials, III-phosphide, III-arsenide, II-VI materials, ZnO, or Si-based materials may be used.

Figure 2:
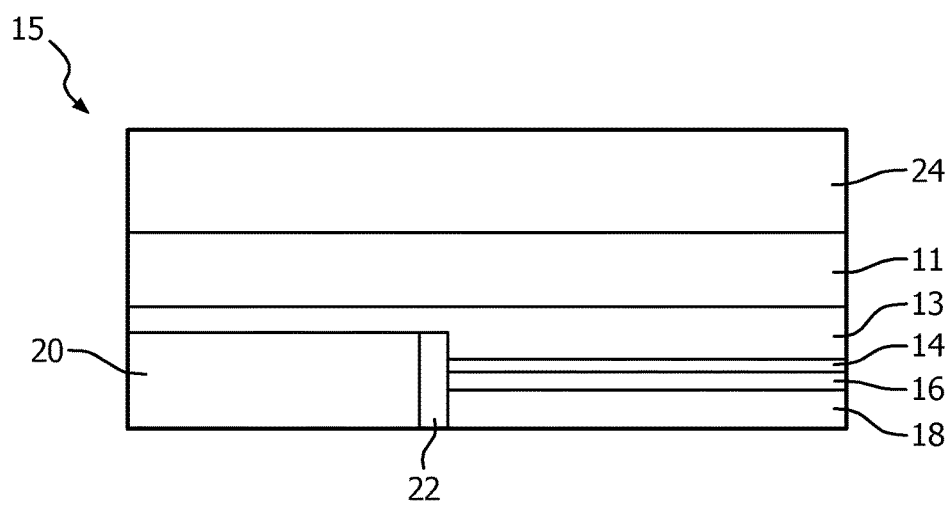
FIG. 2 illustrates one example of a III-nitride LED.

FIG. 2 illustrates a III-nitride LED 15 that may be used in embodiments of the present invention. Any suitable semiconductor light emitting device may be used and embodiments of the invention are not limited to the device illustrated in FIG. 2.

The device of FIG. 2 is formed by growing a III-nitride semiconductor structure on a growth substrate as is known in the art. The growth substrate 11 may be any suitable substrate such as, for example, sapphire, SiC, Si, GaN, or a composite substrate. The semiconductor structure includes a light emitting or active region sandwiched between n- and p-type regions. An n-type region 13 may be grown first and may include multiple layers of different compositions and dopant concentration including, for example, preparation layers such as buffer layers or nucleation layers, and/or layers designed to facilitate removal of the growth substrate, which may be n-type or not intentionally doped, and n- or even p-type device layers designed for particular optical, material, or electrical properties desirable for the light emitting region to efficiently emit light. A light emitting or active region 14 is grown over the n-type region. Examples of suitable light emitting regions include a single thick or thin light emitting layer, or a multiple quantum well light emitting region including multiple thin or thick light emitting layers separated by barrier layers. A p-type region 16 may then be grown over the light emitting region. Like the n-type region, the p-type region may include multiple layers of different composition, thickness, and dopant concentration, including layers that are not intentionally doped, or n-type layers.

After growth, a p-contact 18 is formed on the surface of the p-type region. The p-contact 18 often includes multiple conductive layers such as a reflective metal and a guard metal which may prevent or reduce electromigration of the reflective metal. The reflective metal is often silver but any suitable material may be used. After forming the p-contact 18, a portion of the p-contact 18, the p-type region 16, and the active region 14 is removed to expose a portion of the n-type region 13 on which an n-contact 20 is formed. The n- and p-contacts 20 and 18 are electrically isolated from each other by a gap 22 which may be filled with a dielectric such as an oxide of silicon or any other suitable material. Multiple n-contact vias may be formed; the n- and p-contacts 20 and 18 are not limited to the arrangement illustrated in FIG. 2. The n- and p-contacts may be redistributed to form bond pads with a dielectric/metal stack, as is known in the art. In a flip chip configuration, light typically reflects off contacts 18 and 20 and is extracted from the LED through substrate 11.

In the following figures, the LED 15 illustrated in FIG. 2 is attached to a mount 30. In order to attach the LED 15 to a mount 30, one or more interconnects are formed on or electrically connected to the n- and p-contacts 20 and 18. The interconnects electrically and physically connect the LED 15 to mount 30. The interconnects may be, for example, solder, gold stud bumps, gold layers, or any other suitable structure. Individual LEDs are diced from a wafer of devices, for example, after forming the interconnects on each LED. Additional interconnects may be formed on mount 30. The interconnects formed on the LED 15 and/or on the mount 30 are omitted from the following figures for clarity.

Mount 30 may be any suitable material including, for example, metal, ceramic, or silicon. Vias may be formed within the mount 30 or traces formed on the surface of the mount 30 to electrically connect the top side of the mount, on which the LED 15 is mounted, to the bottom side of the mount, which may be user-attached to another structure such as a printed circuit board.

An individual LED 15 is flipped over relative to the growth direction of the semiconductor structure and attached to mount 30. The LED may be attached to the mount by, for example, ultrasonic bonding, thermosonic bonding, solder attach, or any other suitable bonding technique.

In some embodiments, an underfill material may be disposed between the LED 15 and the mount 30. The underfill may support the semiconductor structure during later processing. The underfill may be, for example, silicone, epoxy, or any other suitable material. The growth substrate may be removed by any suitable technique, may be thinned by any suitable technique, or may remain part of the device.

One or more additional structures 24 may be formed on the surface of the substrate 11 opposite the n-type region 13. For example, additional structures 24 may include filters, wavelength converting layers, lenses, optics, or any other suitable structure.

Separate from LEDs 15 and mount 30, a wavelength converting film is formed. The wavelength converting film absorbs light emitted by the LED and emits light of one or more different wavelengths. Unconverted light emitted by the LED is often part of the final spectrum of light extracted from the structure, though it need not be. Examples of common combinations include a blue-emitting LED combined with a yellow-emitting wavelength converting material, a blue-emitting LED combined with green- and red-emitting wavelength converting materials, a UV-emitting LED combined with blue- and yellow-emitting wavelength converting materials, and a UV-emitting LED combined with blue-, green-, and red-emitting wavelength converting materials. Wavelength converting materials emitting other colors of light may be added to tailor the spectrum of light emitted from the structure.

The wavelength converting film is a suitable transparent material such as silicone or resin loaded with one or more wavelength converting materials such as conventional phosphors, organic phosphors, quantum dots, organic semiconductors, II-VI or III-V semiconductors, II-VI or III-V semiconductor quantum dots or nanocrystals, dyes, polymers, or other materials that luminesce. Though the description below refers to phosphor in silicone, any suitable wavelength converting material or materials and any suitable transparent material may be used. Non-wavelength-converting materials, for example to cause scattering or to alter the index of refraction of the film, may be added to the wavelength converting film.

The wavelength converting film may be formed on a roll of a support film. The support film may be, for example, a commercially available polymer such as ethyl tetra fluoro ethylene (ETFE) foil in any suitable dimension.

To form the wavelength converting film, a phosphor powder is mixed with silicone, or other suitable binder, to form a slurry, and the slurry is sprayed on or otherwise deposited on the support film to a predetermined thickness in a continuous process (assuming a roll is continuously dispensed). In one embodiment, a YAG phosphor (yellow-green) is used. In another embodiment, the phosphor is mixed red and green phosphors. Any combination of phosphors may be used in conjunction with the LED light to make any color light. The density of phosphor, the thickness of the layer, and the type of phosphor or combination of phosphors are selected so that the light emitted by the combination of the LED die and the phosphor(s) has a target white point or other desired color. In one embodiment, the phosphor/silicone layer will be about 30-200 microns thick. Other inert inorganic particles, such as light scattering materials (e.g., silica, $TiO_2$) may also be included in the slurry. The wavelength converting film may include multiple wavelength converting layers in some embodiments, and may include non-wavelength converting layers in some embodiments.

The slurry is then dried, such as by infrared lights or other heat sources, as the support film is unrolled. The resulting dried phosphor/silicone layer may be stored until used as a wavelength converting film. A protective film of any suitable material including, for example, ETFE foil, may be placed over the wavelength converting film, for example in a continuous process. The protective film may be initially provided as a roll and may have a thickness of about 25 microns and the same other dimensions as the support film. The protective film may not be needed if the support film is formed as small sheets and/or if the top surface of the wavelength converting film is not subjected to potentially damaging contacts. Additionally, the protective film may not be needed if the wavelength converting film would not be damaged without the protective film. Neither the support film nor the protective film is strongly affixed to the wavelength converting film.

The wavelength converting film may be tested for its color conversion and matched to particular LED dies generating a certain range of peak wavelengths. Different rolls or sheets of the wavelength converting film having different characteristics may be fabricated for laminating LED dies having different characteristics.

When a wavelength converting film is selected to be laminated onto LEDs attached to a mount, the roll of wavelength converting film may be mounted on a lamination system that dispenses the roll at a certain rate. The protective film, if present, is removed. The wavelength converting film and support film may be cut to about the same size as the mount 30.

Figure 3:
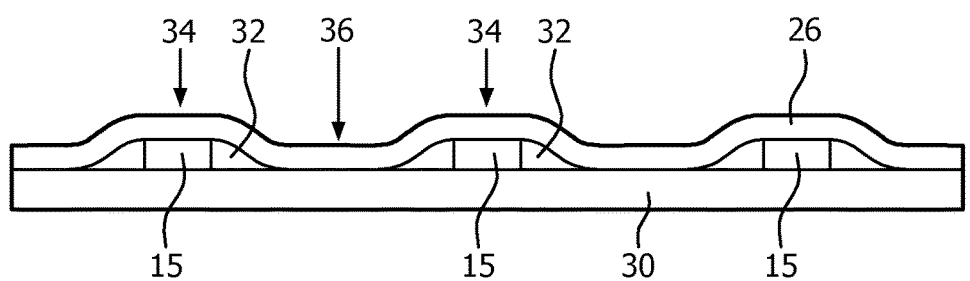
FIG. 3 illustrates LEDs attached to a mount and covered with a wavelength converting film after a first lamination process.

In FIG. 3, wavelength converting film 26 is mounted face down over the LEDs 15 on mount 30. The wavelength converting film 26 may be heated, for example to 40-120° C., to soften it and to cause it to adhere to the tops of LEDs 15 in regions 34, and to the top of mount 30 in regions 36 between LEDs 15. Air pockets 32 form between the wavelength converting film 26 and mount 30 in areas between regions 34 and 36. Air pressure or a structure such as a soft rubbery cushion or a resilient pad (not shown in FIG. 3) may be used to press the wavelength converting film 26 against LEDs 15 and mount 30 in regions 34 and 36. Such a structure may be part of a conventional, commercially available lamination system. An airtight seal may be formed around the periphery of mount 30. The support film may help protect the wavelength converting film 26 during application of the mechanical pressure.

The structure illustrated from FIG. 3 may then be cooled to room temperature. The support film if present may be removed from the wavelength converting film 26. The structure may then be heated to an elevated temperature of about 70-130° C., and a vacuum is created to remove the remaining air between the wavelength converting film 26 and the mount 30. Air in gaps 32 can escape through small pores in the wavelength converting film 26. Generally, the temperature during this second lamination process is higher than the temperature used during the first lamination process to cause the wavelength converting film 26 to stretch down the sides of the LEDs 15 and to adhere to LEDs 15 and mount 30, as illustrated in FIG. 3. The extent of the vacuum and the process times depend on the specific materials used. Generally, a thinner wavelength converting film 26 requires less time to remove the remaining air in gaps 32 than a thicker wavelength converting film 26. Air is then allowed to enter the chamber to pressurize the chamber, which stretches the wavelength converting film 26 around the LEDs 15, causing the wavelength converting film 26 to encapsulate LEDs 15, as illustrated in FIG. 4.

Figure 4:
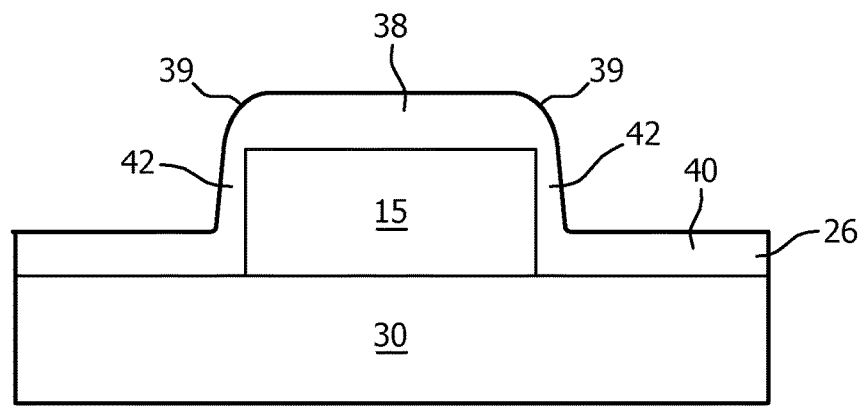
FIG. 4 illustrates an LED covered with a wavelength converting film after a second lamination process.

The LED 15 illustrated in FIG. 4 may be, for example, at least 200 μm tall. Because the second lamination process stretches the wavelength converting film 26 over the sides of LEDs 15, in the device of FIG. 4, the wavelength converting film 26 is thinner on the sides 42 and corners 39 of LEDs 15 and thicker in the areas 38 over the tops of LEDs 15 and in the areas 40 on the mount 30 between LEDs 15. The difference in thickness between the sides and corners 42 and 39, and top 38 of LED 15 can cause undesirable variations in the color of light emitted from the device. In particular, light from the device illustrated in FIG. 4, when viewed from above, may appear more yellow or white in the center of the device and more blue at the sides and corners of the device. In structures with a secondary optics such as a reflector or refractor in close proximity to the LED, the variations in color may create an undesirable non-uniform color field.

Figure 5:
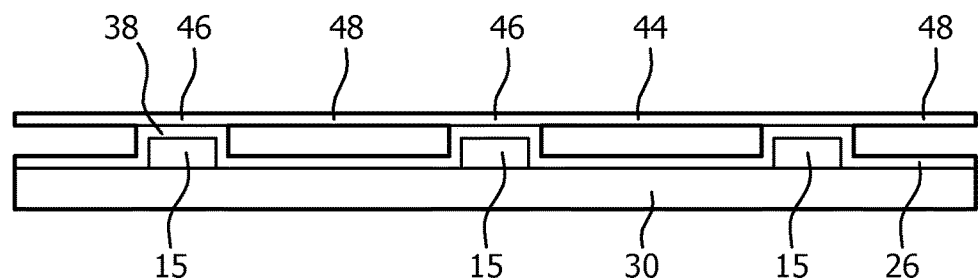
FIG. 5 illustrates LEDs attached to a mount and covered with a wavelength converting film during a third lamination process.

In embodiments of the invention, a third lamination process is performed. The third lamination process reduces the thickness of the wavelength converting film 26 over the tops of LEDs 15, as illustrated in FIG. 5. During the third lamination process, a flattening element 44 presses down on the wavelength converting film 26 that is disposed on the tops of LEDs 15, thinning the wavelength converting film 26 in the regions 38 over the tops of LEDs 15. The flatting element 44 may be any material that is sufficiently rigid that it does not bow over an area 46 that corresponds to a single LED 15 (for example, an area of about 1 mm$^2$) and is sufficiently flexible that it can bow over an area 48 between adjacent LEDs 15 (for example, adjacent LEDs 15 may be spaced at least 3 mm apart). The flattening element 44 may be designed to bow over an area 48 between adjacent LEDs 15 to compensate for variations in the height of the tops of LEDs 15, such that the thickness of the wavelength converting film 26 over each LED 15 after the third lamination process is uniform, regardless of the height of each LED 15. One example of a suitable flattening element 44 is a spring steel plate. The flattening element may be used in a conventional lamination machine.

In some embodiments, the third lamination process is similar to the first lamination process illustrated in FIG. 3, except that the flattening element 44 is substituted for the soft rubbery cushion used in the first lamination process. The wavelength converting film 26 may be heated, for example to 40-120° C., to soften it. Flattening element 44 may be used to press the wavelength converting film 26 against LEDs 15 such that a portion of the material in the wavelength converting film 26 that is initially disposed over the top of LED 15 is pressed by flattening element 44 out over the sides of LEDs 15, thinning the wavelength converting film 26 over the tops of LEDs 15 and thickening a portion of the sidewall material.

Figure 6:
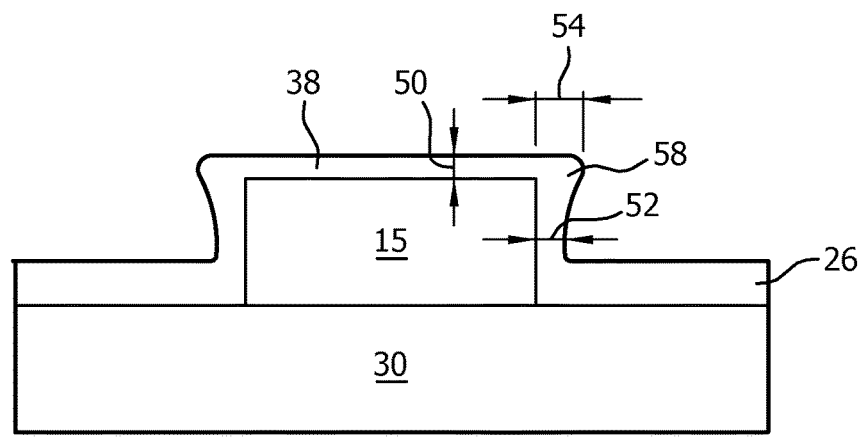
FIG. 6 illustrates an LED covered with a wavelength converting film after third lamination process illustrated in FIG. 5.

FIG. 6 illustrates an LED after the third lamination process described in FIG. 5. Wavelength converting film 26 is substantially conformal to LED 15, i.e. the outer surface of the wavelength converting film 26 is the same shape as the outer surface of LED 15. The thickness 50 of wavelength converting film 26 over the top of LED 15 after the third lamination process may be less than 90% in some embodiments, less than 80% in some embodiments, and less than 70% in some embodiments of the thickness of wavelength converting film 26 over the top of LED 15 before the third lamination process. The portion 38 of the wavelength converting film 26 over the top of LED 15 is flattened, which causes the wavelength converting film 26 to thicken at the edges 58 of the LED 15. The top portion 38 may be flattened such that the thickness 52 of the wavelength converting film 26 at the side of LED 15 where the wavelength converting film is thinnest is at least 70% in some embodiments, at least 80% in some embodiments, and at least 90% in some embodiments of the thickness 50 of the wavelength converting film 26 over the top of LED 15. The thickness of the wavelength converting film 26 may differ along the side of LED 15. For example, near the top of LED 15, where the excess material from the top of LED 15 is forced by flattening element 44, the wavelength converting film 26 along the side of LED 15 may be thicker than it is near the bottom of LED 15, as indicated by thicknesses 54 and 52 in FIG. 6. For example, the thickness 52 of wavelength converting film 26 along the side of LED 15 near the bottom may be at least 70% in some embodiments, at least 80% in some embodiments, and at least 90% in some embodiments of the thickness 54 of wavelength converting film 26 along the side of LED 15 near the top.

The amount of flattening of the wavelength converting film over the top of the LED may be adjusted as part of the third lamination process. For example, more pressure and higher temperature during the third lamination process may cause more thinning of the wavelength converting film over the top of the LED, which may result in more wavelength converting material being pushed to the sides of the LED. Such a device would have more blue emission from the top of the device and less blue emission from the sides of the device than a device with a thicker wavelength converting film over the top of the LED. Accordingly, the color field of light emitted by the device may be adjusted by adjusting the third lamination process.

Since the third lamination process is similar to the first lamination process described in FIG. 3, in some embodiments, instead of a separate third lamination process, the thinning of the wavelength converting film over the top of the LEDs is performed during the first lamination process. For example, during the first lamination process described in FIG. 3, instead of a soft rubbery cushion, a flattening element 44 as described in reference to FIG. 5 may be used to thin the wavelength converting film over the tops of the LEDs at the same time the wavelength converting film 26 is adhered to the tops of the LEDs, as described above in reference to FIG. 3.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

The invention claimed is:

1. A method comprising:
   laminating a film over a plurality of light emitting diodes (LEDs) disposed on a mount by mounting the film over the plurality of LEDs and applying a heat of a first temperature under a pressure, such that the film covers the LEDs and adheres to the mount in areas between neighboring LEDs and forms a laminated structure;
   cooling the laminated structure;
   applying heat of a second temperature to the laminated structure in a vacuum, the second temperature being higher than the first temperature; and
   after applying the heat of the second temperature to the laminated structure in the vacuum, reducing a thickness of a portion of the film disposed over top surfaces of the plurality of LEDs by pressing a flattening element against the top surfaces of the plurality of LEDs while applying heat of a third temperature that is the same as or different than the first temperature.

2. The method of claim 1 wherein reducing a thickness of a portion of the film disposed over the plurality of LEDs comprises reducing the thickness of the portion of the film disposed over the top surfaces of the plurality of LEDs to less than 80% of a thickness of the film before said reduction.

3. The method of claim 1 wherein the film comprises a wavelength converting material mixed with silicone.

4. The method of claim 1 wherein the flattening element comprises a steel plate.

5. The method of claim 1 wherein the plurality of LEDs are at least 200 μm tall and the film is between 30 and 200 μm thick.

6. The method of claim 1, wherein the first temperature is between 40 and 120° C.

7. The method of claim 1 wherein: the third temperature is between 40 and 120° C.

8. The method of claim 7, wherein the second temperature is between 70 and 120° C.

9. The method of claim 1 wherein the film that adheres to the mount in the areas between the neighboring LEDs forms depressions between the LEDs.

10. The method of claim 1, wherein the applying the second heat to the laminated structure under the vacuum stretches the film over sides of the LEDs such that the portion of the film disposed over the top surfaces of the LEDs is thicker than a portion of the film disposed adjacent the sides of the LEDs.

* * * * *